(12) United States Patent
Gopalan

(10) Patent No.: US 11,373,890 B2
(45) Date of Patent: Jun. 28, 2022

(54) WIRELESS IN-SITU REAL-TIME MEASUREMENT OF ELECTROSTATIC CHUCKING FORCE IN SEMICONDUCTOR WAFER PROCESSING

(71) Applicant: APPLIED MATERIALS, INC., Santa Clara, CA (US)

(72) Inventor: Ramesh Gopalan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 16/702,994

(22) Filed: Dec. 4, 2019

(65) Prior Publication Data

US 2020/0194290 A1 Jun. 18, 2020

Related U.S. Application Data

(60) Provisional application No. 62/780,698, filed on Dec. 17, 2018.

(51) Int. Cl.
*H01L 21/67* (2006.01)
*H01L 21/683* (2006.01)
*H01J 37/32* (2006.01)

(52) U.S. Cl.
CPC .. *H01L 21/67253* (2013.01); *H01J 37/32715* (2013.01); *H01L 21/6833* (2013.01); *H01L 21/6838* (2013.01)

(58) Field of Classification Search
CPC ......... H01L 21/67109; H01L 21/67253; H01L 21/6833; H01L 21/6838; H01L 21/6875; H01L 21/32715
See application file for complete search history.

(56) References Cited

U.S. PATENT DOCUMENTS

| | | | | |
|---|---|---|---|---|
| 6,166,897 A | * | 12/2000 | Matsunaga | H02N 13/00 361/234 |
| 2007/0245808 A1 | * | 10/2007 | Henttonen | G01N 3/12 73/37 |
| 2008/0231291 A1 | * | 9/2008 | Ramsey | G01B 7/023 324/662 |
| 2011/0174777 A1 | * | 7/2011 | Jensen | H01J 37/32935 216/61 |
| 2013/0080099 A1 | * | 3/2013 | Akada | H02J 7/025 702/81 |
| 2016/0116518 A1 | * | 4/2016 | Wang | G01R 29/24 324/457 |
| 2016/0131700 A1 | * | 5/2016 | Kang | G01R 31/2891 324/750.01 |
| 2019/0080949 A1 | * | 3/2019 | Boyd, Jr. | H01J 37/32715 |

(Continued)

*Primary Examiner* — Mohammed Shamsuzzaman
(74) *Attorney, Agent, or Firm* — Schwabe, Williamson & Wyatt, P.C.

(57) ABSTRACT

Embodiments disclosed herein include an apparatus for measuring chucking force and methods of using such apparatuses. In an embodiment, the apparatus for measuring a chucking force comprises a substrate having a chucking surface, where the chucking surface is the surface that is supported by a chuck. In an embodiment, the apparatus further comprises a plurality of sensors over the chucking surface, where the plurality of sensors are thin film sensors with a thickness that is less than a thickness of the substrate. In an embodiment, the apparatus further comprises a wireless communication module electrically coupled to each of the plurality of sensors.

8 Claims, 6 Drawing Sheets

(56) References Cited

U.S. PATENT DOCUMENTS

| | | | |
|---|---|---|---|
| 2019/0206712 A1* | 7/2019 | Boyd, Jr. | H01J 37/32449 |
| 2020/0072594 A1* | 3/2020 | Potter | G01B 7/08 |
| 2020/0103294 A1* | 4/2020 | Potter | G01L 1/16 |

* cited by examiner

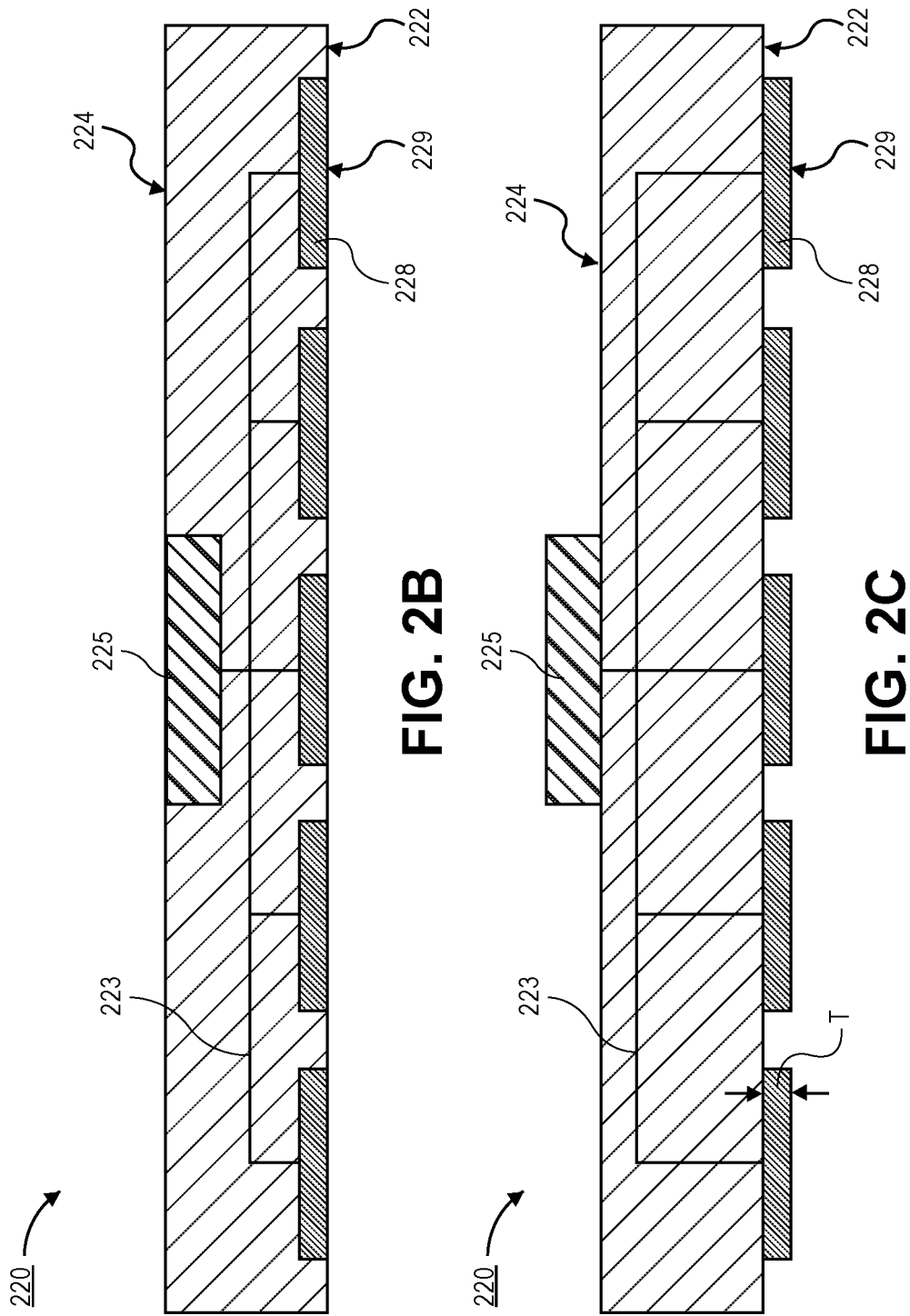

WIRELESS IN-SITU REAL-TIME MEASUREMENT OF ELECTROSTATIC CHUCKING FORCE IN SEMICONDUCTOR WAFER PROCESSING

This application claims the benefit of U.S. Provisional Application No. 62/780,698, filed on Dec. 17, 2018, the entire contents of which are hereby incorporated by reference.

BACKGROUND

Field

Embodiments relate to the field of semiconductor manufacturing and, in particular, to methods and apparatuses for measuring the chucking force in-situ and in real-time.

Description of Related Art

In the processing of substrates, such as semiconducting wafers, the wafers are secured to a chuck during processing. Currently, there is no way to accurately measure the chucking force across the wafer. The only way to monitor the chucking force is to reduce the chucking voltage until the force is not sufficient to hold the wafer to the electrostatic chuck, and backside helium flow increases. Such a process only provides a measure of the minimum chucking voltage to secure the wafer. Accordingly, it is not possible to measure chucking force uniformity. Additionally, it is not possible to compare the chucking force between chambers in order to provide chamber matching information.

As such, the substrates being processed are over-chucked. That is, the chucking force applied to the substrates is substantially larger than is necessary in order to guarantee that the substrate is properly secured. Such over-chucking leads to damage of the chucking surface of the substrate (i.e., the backside of the wafer) being processed and to the chuck itself. Accordingly, there is an increase in particle generation and a reduced useable lifespan of the chuck.

SUMMARY

Embodiments disclosed herein include an apparatus for measuring chucking force and methods of using such apparatuses. In an embodiment, the apparatus for measuring a chucking force comprises a substrate having a chucking surface, where the chucking surface is the surface that is supported by a chuck. In an embodiment, the apparatus further comprises a plurality of sensors over the chucking surface, where the plurality of sensors are thin film sensors with a thickness that is less than a thickness of the substrate. In an embodiment, the apparatus further comprises a wireless communication module electrically coupled to each of the plurality of sensors.

Embodiments disclosed herein may also comprise a system for measuring the real-time chucking forces on a substrate. In an embodiment, the system comprises a processing tool with a chamber and a support surface in the chamber for securing substrates with a chucking force. In an embodiment, the system further comprises a substrate with a chucking surface, where the chucking surface is secured to the support surface by the chucking force. In an embodiment, a plurality of sensors are positioned over the chucking surface of the substrate. The sensors measure the chucking force. In an embodiment, the system may further comprise a wireless communication module electrically coupled to the plurality of sensors, where the wireless communication module transmits chucking force data outside of the chamber.

Embodiments may also comprise a method of optimizing a semiconductor fabrication process recipe. In an embodiment, the method comprises placing a substrate having a plurality of thin film sensors on a chucking surface of the substrate on a support surface in a processing tool. The method may also comprise securing the substrate to the support surface with a chucking force, where the plurality of thin film sensors provide a measurement of the chucking force across a surface of the substrate. In an embodiment, the method may further comprise executing a process recipe in the processing tool, and obtaining chucking force measurements from the plurality of sensors during execution of the process recipe. In an embodiment, the method may further comprise using the chucking force measurements to modify the process recipe.

BRIEF DESCRIPTION OF THE DRAWINGS

FIG. 2B is a cross-sectional illustration of a substrate with a plurality of embedded thin-film sensors, in accordance with an embodiment.

FIG. 2C is a cross-sectional illustration of a substrate with a plurality of thin-film sensors over the chucking surface, in accordance with an embodiment.

DETAILED DESCRIPTION

Figure 1:
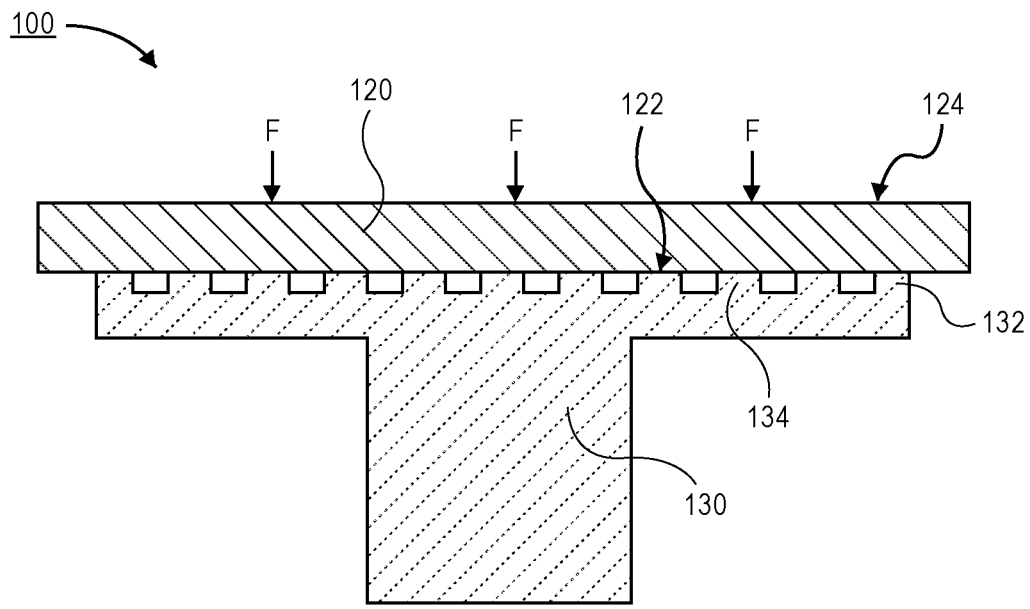
FIG. 1 is a cross-sectional illustration of a substrate secured to a support surface with a chucking force, in accordance with an embodiment.

Systems that include substrates with thin-film sensors over a chucking surface of the substrate and methods of using such thin-film sensors to measure a chucking force profile over the chucking surface are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, there are currently no tools that can be used to measure the chucking force applied to a chucking surface of a substrate. Accordingly, substrates need to be over-chucked in order to guarantee that the substrate is properly secured during processing. Such over-chucking results in damage to the chucking surface of the substrate and damage to the chuck itself.

Accordingly, embodiments disclosed herein include a substrate with a plurality of thin-film sensors distributed across the chucking surface of the substrate. In accordance with an embodiment, the thin-film sensors have a thickness that is substantially less than the thickness of the substrate (e.g., 100 μm or less). As such, embodiments disclosed herein provide the ability to measure the chucking force without affecting the form factor of standard wafer dimensions.

Additionally, embodiments may also include a wireless communication module that allows for the chucking force profile to be monitored in real-time. Accordingly, measurement of a chucking force profile during a process recipe may be obtained. This is particularly beneficial since RF plasma processing may alter the chucking force across the substrate. In a particular embodiment, the wireless communication module may operate at a frequency that does not interact with the RF plasma (e.g., 2.4 GHz) in order to more accurately monitor the chucking force that will be experienced by device wafers being processed in the processing tool.

As such, embodiments disclosed herein include sensor substrates that substantially match the form factor and behavior of device wafers during execution of a processing recipe. The sensor substrates, therefore, provide an accurate representation of the chucking force experienced by device wafers. Accordingly, such sensor substrates may be used to optimize the chucking force in order to minimize damage to the chucking surface of device wafers and/or to minimize damage to the chuck itself. Embodiments, therefore, provide reduced particle generation and increased chuck lifespans. Embodiments may also allow for improved chamber matching since each chamber may be calibrated to provide a uniform chucking force across chambers.

Referring now to FIG. 1, a cross-sectional schematic of a processing tool 100 is shown, in accordance with an embodiment. In an embodiment, the processing tool 100 may include a support surface 130 on which a substrate 120 is supported. The substrate 120 may comprise a chucking surface 122 that is in direct contact with the support surface 130 and a second surface 124 that is opposite from the chucking surface 122. The support surface 130 may include a mechanism for providing a chucking force F to secure the substrate 120 to the support surface 130. In a particular embodiment, the support surface 130 may be an electrostatic chuck (ESC), a vacuum chuck, a heater pedestal, or any other support surface used in semiconductor manufacturing environments. In an embodiment, the support surface 130 may be one or more of a Coulombic chuck, a Johnson-Rahbek (J-R) chuck, a monopolar ESC, and a bipolar ESC. In an embodiment, the support surface 130 may include sealing bands 132 around the perimeter of the support surface 130 and a plurality of mesas 134 within the sealing bands 132. The sealing bands 132 and the mesas 134 may provide channels through which fluids (e.g., helium) may be flown for thermal management purposes, as is known in the art.

As noted above, the standard practice to secure the substrate 120 to the support surface 130 involves over-chucking the substrate 120. That is, the chucking force F applied to the substrate 120 is greater than necessary to secure the substrate 120 to the support surface 130 since there is currently no way to monitor the chucking force. The over-chucking results in damage to the chucking surface 122 of the substrate 120 and damage to the sealing bands 132 and the mesas 134.

Figure 2A:
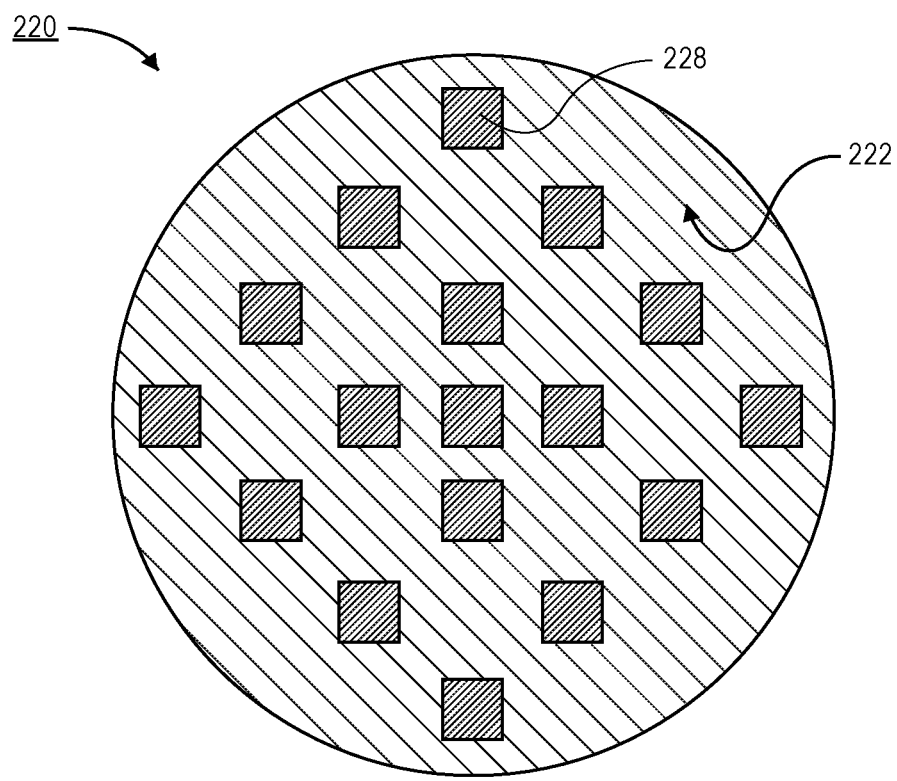
FIG. 2A is a plan view illustration of a chucking surface of a substrate that includes a plurality of thin-film sensors, in accordance with an embodiment.

Accordingly, embodiments disclosed herein include a substrate with a plurality of thin-film sensors distributed across the chucking surface. For example, FIG. 2A is a plan view illustration of the chucking surface 222 of a sensor substrate 220, in accordance with an embodiment. In an embodiment, the sensor substrate 220 may have substantially the same form factor as devices wafers. For example, the sensor substrate 220 may have a diameter (e.g., 150 mm, 200 mm, 300 mm, 450 mm, or the like) that substantially matches the diameter of the device wafers. In an embodiment, a thickness of the sensor substrate 220 may also substantially match the thickness of the device wafers. In an embodiment, the sensor substrate 220 may also comprise the same material as the device wafers. For example, the sensor substrate 220 may comprise a silicon substrate.

In an embodiment, the chucking surface 222 may comprise a plurality of thin-film sensors 228 distributed across the chucking surface 222. Distributing the thin-film sensors 228 across the chucking surface 222 allows for the chucking force across the sensor substrate 220 to be obtained. This is particularly beneficial since the chucking force may be non-uniform across the chucking surfaces 222 (e.g., due to variations in the support surface 130, variations in the plasma process, or the like). Accurate mapping of the chucking force profile across the chucking surface 222 allows for fine adjustments to the chucking force to be made in order to optimize process recipes, provide chamber matching, minimize particle generation, and/or minimize damage to the support surface 130.

In the illustrated embodiment, seventeen thin-film sensors 228 are shown. However, it is to be appreciated that any number of thin-film sensors 228 may be included on the sensor substrate 220. For example, one or more thin-film sensors 228, tens of thin-film sensors 228, hundreds of thin-film sensors 228, or thousands of thin-film sensors 228 may be formed over the chucking surface 222 of the sensor substrate 220 in order to provide the desired resolution of the chucking force mapping. In a particular embodiment, a total surface area of the thin-film sensors 228 may be approximately 30% or less, 20% or less, or 10% or less of the total surface area of the chucking surfaces 222. Accordingly, embodiments allow for larger proportions of the chucking surface 222 to match the actual chucking surfaces of device wafers in order to provide a more accurate representation of the chucking forces experienced by device wafers. Furthermore, while schematically represented as being square in shape, it is to be appreciated that the thin-film sensors 228 may be any desired shape or shapes.

Referring now to FIG. 2B, a cross-sectional illustration of a sensor substrate 220 is shown, in accordance with an embodiment. In the illustrated embodiment, the plurality of thin-film sensors 228 are shown as being substantially embedded in the sensor substrate 220. For example, surfaces 229 of the thin-film sensors 228 may be substantially coplanar with the chucking surfaces 222 of the sensor substrate 220.

In an embodiment, the plurality of thin-film sensors 228 may be electrically coupled (e.g., with conductive traces 223) to a wireless communication module 225. In an embodiment, the wireless communication module 225 may comprise a transceiver for communicating wirelessly with a device located outside of the processing tool being monitored by the sensor substrate 220. The wireless communication may be implemented at any frequency and/or with any suitable wireless communication protocol (e.g., WiFi, Bluetooth, Zigbee, or the like). In a particular embodiment, the frequency used by the wireless communication module 225 may be significantly greater than the frequency at which a plasma source operates in order to minimize interference with the plasma. For example, the wireless communication module 225 may operate at 2.4 GHz, which is substantially above the frequency commonly used for RF plasma generation.

In an embodiment, the wireless communication module 225 may also comprise other circuitry and/or components. For example, the wireless communication module 225 may also comprise a power source (e.g., a battery) for operating the thin-film sensors 228 and/or for enabling wireless communication. In other embodiments, a power source may be a separate component distinct from the wireless communication module 225. In an embodiment, the wireless communication module 225 may also comprise a memory, a processor, or any other passive or active circuitry blocks. As shown in FIG. 2B, the wireless communication module 225 may be embedded in the sensor substrate 220. That is, all or substantially all of the wireless communication module 225 may be below the second (i.e., top) surface 224 of the sensor substrate 220.

Referring now to FIG. 2C, a cross-sectional illustration of a sensor substrate 220 is shown, in accordance with an additional embodiment. The sensor substrate 220 in FIG. 2C may be substantially similar to the sensor substrate 220 in FIG. 2B, with the exception that the thin-film sensors 228 and the wireless communication module 225 are not embedded in the sensor substrate 220.

As shown, the thin-film sensors 228 may be disposed over the chucking surface 222. That is, the bottom surface 229 of the thin-film sensors 228 (i.e., the surface that interfaces with the support surface of the chuck) is not substantially coplanar with the chucking surface 222 of the sensor substrate 220. However, it is to be appreciated that the thickness T of the thin-film sensors 228 is substantially smaller than the thickness of the sensor substrate 220 in order to minimize any effects attributable to the thin-film sensors. For example, the thickness T of the thin-film sensors 228 may be 100 μm or less, 50 μm or less, or 25 μm or less.

In an embodiment, the wireless communication module 225 may also not be embedded in the sensor substrate 220. For example, the wireless communication module 225 may be positioned over the second (i.e., top) surface 224 of the sensor substrate 220. In such an embodiment, the sensor substrate 220 may only comprise electrical traces 223 to connect the thin-film sensors 228 to the wireless communication module 225. That is, in some embodiments, no active circuitry may be embedded in the sensor substrate 220, and any components (e.g., the thin-film sensors 228 and the wireless communication module 225) may be positioned over the chucking surface 222 or the second surface 224 of the sensor substrate 220.

Figure 3:
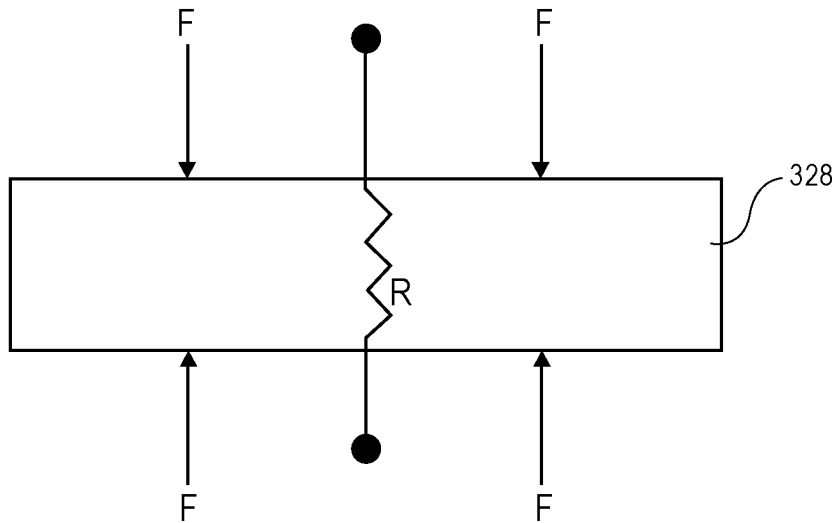
FIG. 3 is a schematic of a thin-film sensor with a variable resistance that is correlated to the amount of pressure applied to the thin-film sensor, in accordance with an embodiment.

Referring now to FIG. 3, a schematic of a thin-film sensor 328 is shown, in accordance with an embodiment. In an embodiment, thin-film sensor 328 is a force sensor. The force sensor may comprise a body that has an electrical resistance R that varies with the amount of compressive force F applied to the body. In a particular embodiment, the electrical resistance R may be correlated to a pressure (i.e., force F divided by the area of the thin-film sensor) applied to the thin-film sensor 328. For example, as the force F (and pressure) increases, the resistance R may also change with a known relationship (e.g., the resistance R may be inversely proportional to the pressure (i.e., force F divided by area of the thin-film sensor) applied to the thin-film sensor 328. Accordingly, the compressive force (i.e., the chucking force) can be determined by monitoring the resistance of the thin-film sensor 328. In an embodiment, the thin-film sensor 328 may comprise any suitable material that exhibits such a relationship between force and resistance. For example, the thin-film sensor 328 may comprise semiconductor material that can be deposited as an ink or a film that is sandwiched between conductive pads, traces, or the like.

Figure 4:
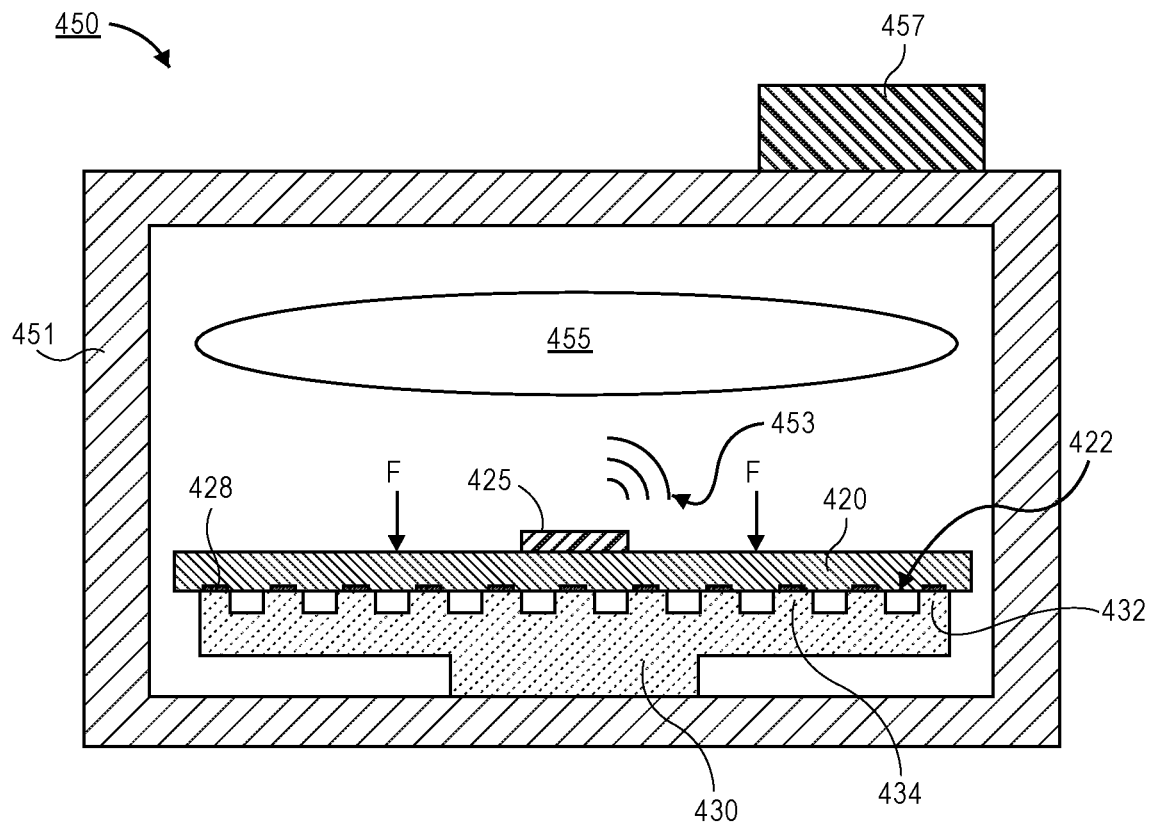
FIG. 4 is a schematic of a processing tool that includes a substrate with a plurality of thin-film sensors on a chucking surface of the substrate for measuring the chucking force, in accordance with an embodiment.

Referring now to FIG. 4, a cross-sectional schematic of a processing tool 450 that is being monitored with a sensor substrate 420 is shown, in accordance with an embodiment. The processing tool 450 may comprise a chamber 451 suitable for semiconductor processing. In a particular embodiment, the chamber 451 may be a vacuum chamber suitable for processing operations in which a plasma 455 is induced. In other embodiments, the processing tool 450 may be any processing tool that is used in semiconductor fabrication applications, and may omit the presence of a chamber. For example, the processing tool 450 may be a heater pedestal, or the like.

In an embodiment, the processing tool 450 may comprise a support surface 430. The support surface 430 may be an ESC, a vacuum chuck, or the like. In an embodiment, the support surface 430 may be one or more of a Coulombic chuck, a J-R chuck, a monopolar ESC, and a bipolar ESC. In an embodiment, the support surface 430 may include sealing bands 432 around the perimeter of the support surface 430 and a plurality of mesas 434 within the sealing bands 432. The sealing bands 432 and the mesas 434 may provide channels through which fluids (e.g., helium) may be flown for thermal management purposes, as is known in the art.

In an embodiment, a sensor substrate 420 may be disposed on the support surface 430. That is, a chucking surface 422 of the sensor substrate 420 may interface with the support surface 430. The sensor substrate 420 may be a sensor substrate such as those described above with respect to FIGS. 2A-2C. For example, the sensor substrate 420 may comprise a plurality of thin-film sensors 428 disposed across the chucking surface 422 of the sensor substrate 420. In a particular embodiment, the thin-film sensors 428 may be arranged such that they are positioned between the sealing bands 432 and the sensor substrate 420 and/or between the mesas 434 and the sensor substrate 420. Accordingly, as a chucking force F is applied to the sensor substrate the thin-film sensors 428 will provide a chucking force profile across the chucking surface 422 of the sensor substrate 420.

In an embodiment, the chucking force profile may be transmitted in substantially real-time by a wireless communication module 425 of the sensor substrate 420. For example, wireless communication 453 may be transmitted to a receiver 457 located outside of the processing tool 450. In an embodiment, the frequency of the wireless communication 453 may be different than the frequency of the plasma 455 in order to minimize or eliminate any adverse interference with the plasma 455. For example, the wireless communication 453 may be transmitted at 2.4 GHz using a Bluetooth compatible communication protocol.

Figure 5:
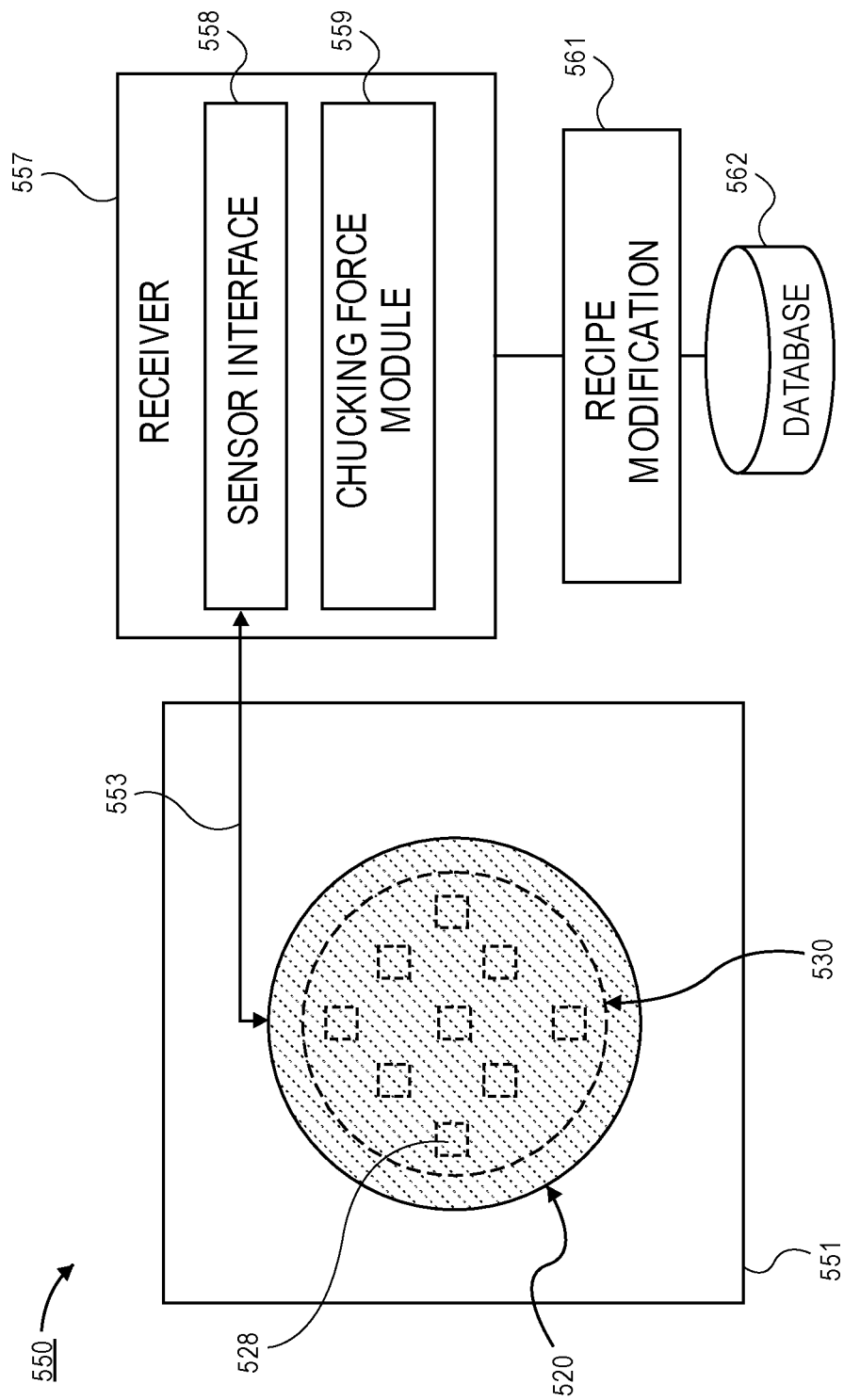
FIG. 5 is schematic block diagram of a processing tool that includes a system for monitoring a chucking force profile across a chucking surface of a substrate, in accordance with an embodiment.

Referring now to FIG. 5, a schematic of a processing tool 550 and a receiver 557 used to generate and use a chucking force profile is shown, in accordance with an embodiment. As shown, the processing tool may comprise a chamber 551 and a support surface 530. The chamber and support surface 530 may be substantially similar to embodiments described above with respect to FIG. 4. In an embodiment, a sensor substrate 520 that comprises a plurality of thin-film sensors 528 may be supported by the support surface 530. The thin-film sensors 528 are illustrated with a dashed line in order to indicate that the thin-film sensors 528 are positioned between a chucking surface of the sensor substrate 520 and the support surface 530.

In an embodiment, the sensor substrate 520 may be communicatively coupled to a receiver 557 outside of the processing tool 550 (e.g., with a wireless communication signal 553). In an embodiment, the receiver 557 may include a sensor interface 558 for receiving raw data from the thin-film sensors 528. In an embodiment, the sensor interface 558 may convert electrical signals (e.g., resistance values) into a measure of force. While shown as being part of the receiver 557 outside of the processing tool 550, it is to be appreciated that the sensor interface 558 may also be implemented as a component on the sensor substrate 520 and the raw data from the thin-film sensors 528 may be processed prior to being transmitted to the receiver 557.

After processing by the sensor interface 558, the processed data may be displayed and/or stored in memory as a chucking force profile by the chucking force module 559. The chucking force profile provides a visual representation of the chucking force across the surface of the sensor substrate 520. Furthermore, the chucking force profile may change over time. That is, the chucking force experienced by a given thin-film sensor may change during the execution of a process recipe. The change of the chucking force profile over time may also be captured (e.g., displayed and/or stored in memory) by the chucking force module 559.

In an embodiment, the chucking force module 559 may also comprise software that utilizes the chucking force profile (or profiles) in order to provide instructions/modifications 561 to a database 562 for future use. For example, the instructions/modifications may include one or more of modifications to a process recipe, chamber matching information, end of useable life determinations for the support surface, or the like.

Figure 6:
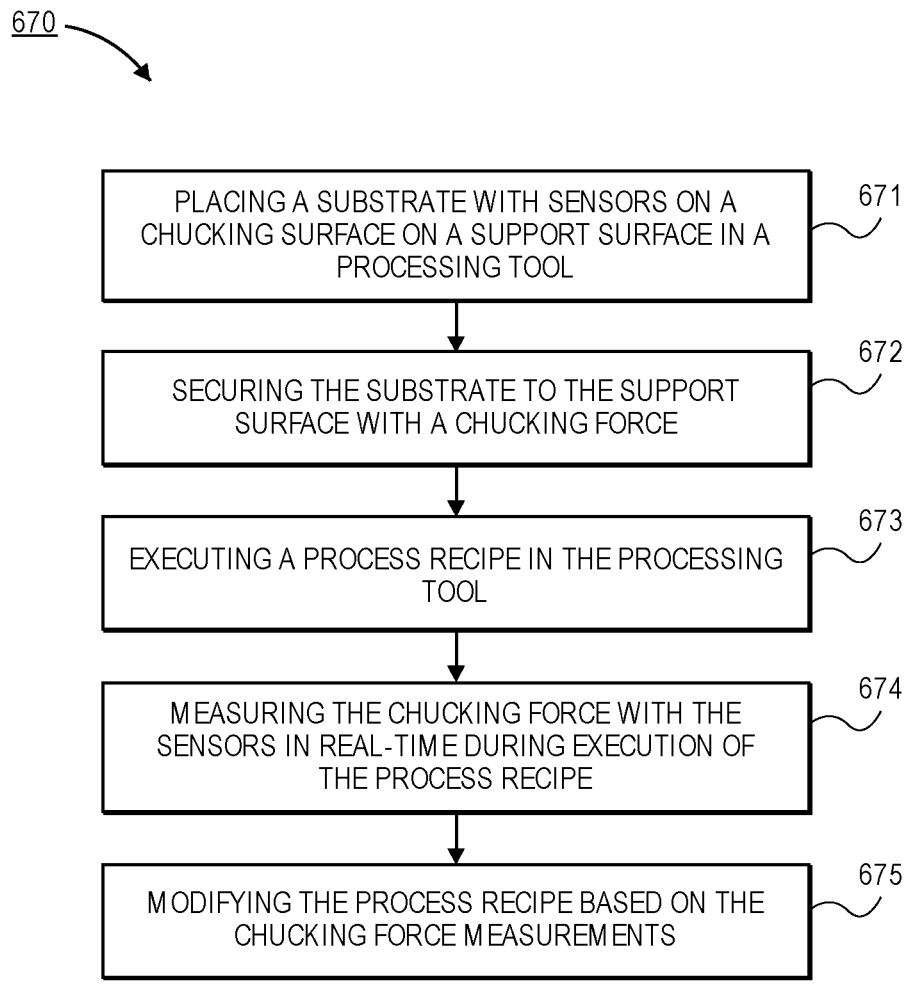
FIG. 6 is a process flow diagram of a process for using a chucking force profile to modify a process recipe, in accordance with an embodiment.

Referring now to FIG. 6, a process flow diagram of a process 670 for modifying a process recipe using a chucking force profile generated with a sensor substrate is shown, in accordance with an embodiment. In an embodiment, process 670 may being with operation 671 which includes placing a substrate with sensors on a chucking surface onto a support surface in a processing tool. Process 670 may continue with operation 672 which comprises securing the substrate to the support surface with a chucking force. In an embodiment, process 670 may then continue with operation 673 which comprises executing a process recipe in the processing tool. In an embodiment, process 670 may also comprise operation 674 which includes measuring the chucking force with the sensors in real-time during execution of the process recipe. Since the chucking force is measured in real-time, the changes to the chucking force that occur during changing processing conditions during the process recipe may be monitored. In an embodiment, process 670 may then include operation 675 which comprises modifying the process recipe based on the chucking force measurements. For example, the process recipe may be modified by increasing or decreasing the chucking force applied to the substrate.

Figure 7:
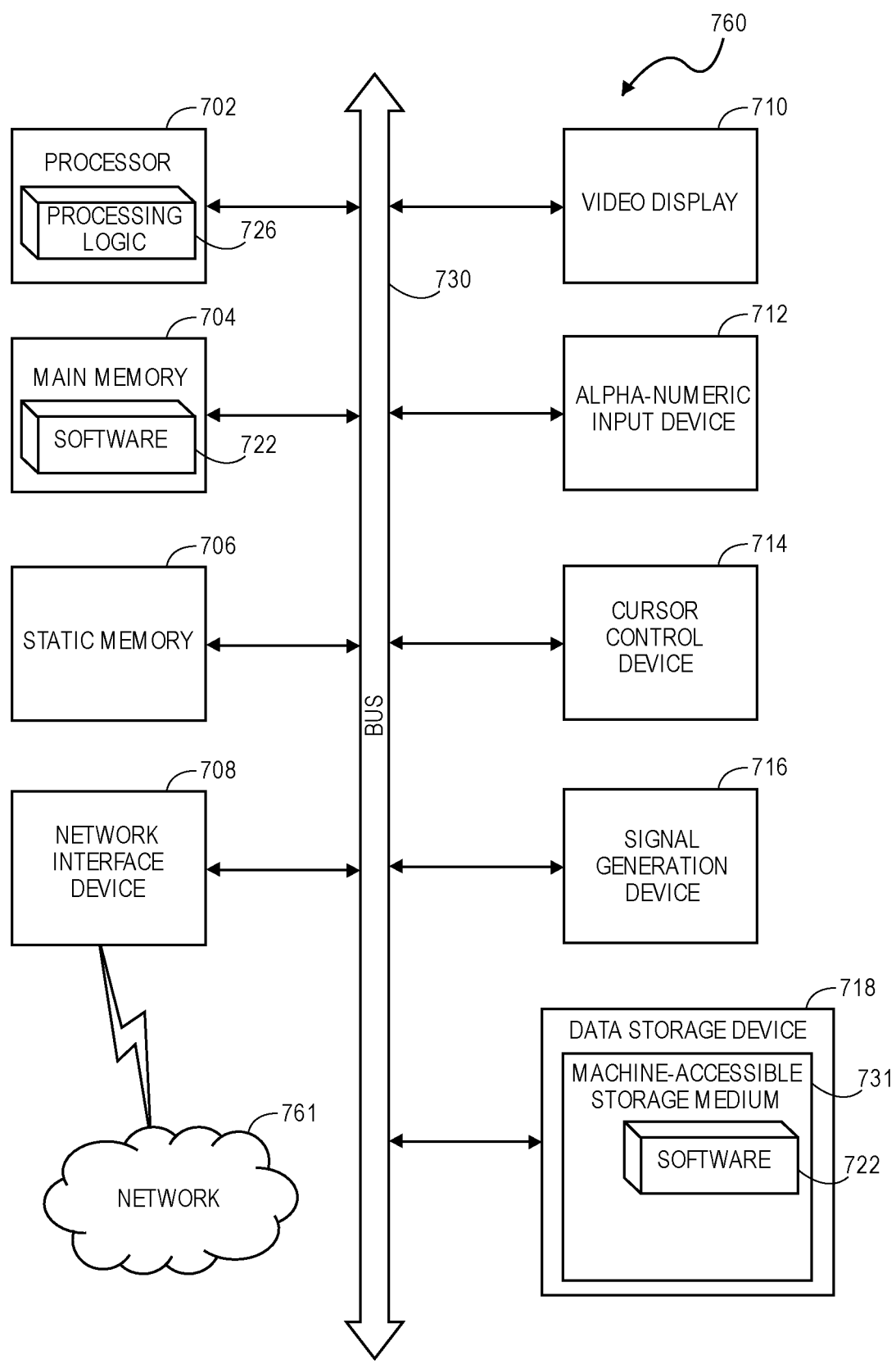
FIG. 7 illustrates a block diagram of an exemplary computer system that may be used in conjunction with processes that include determining the chucking force across a substrate, in accordance with an embodiment.

Referring now to FIG. 7, a block diagram of an exemplary computer system 760 of a processing tool is illustrated in accordance with an embodiment. In an embodiment, the computer system 760 may be used as the receiver that is communicatively coupled to the sensor substrate. In an embodiment, computer system 760 is coupled to and controls processing in the processing tool. Computer system 760 may be connected (e.g., networked) to other machines in a network 761 (e.g., a Local Area Network (LAN), an intranet, an extranet, or the Internet). Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., flash memory, etc.), a static memory 706 (e.g., flash memory, etc.), and a secondary memory 718 (e.g., a data storage device), which communicate with each other via a bus 730.

System processor 702 represents one or more general-purpose processing devices such as a microsystem processor, central processing unit, or the like. System processor 702 may also be one or more special-purpose processing devices. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 761 via the system network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An apparatus for measuring a chucking force, comprising:
    a substrate having a chucking surface, wherein the chucking surface is adapted to be supported by a chuck in a processing tool;
    a plurality of sensors embedded in the substrate, wherein the plurality of sensors are thin film sensors with a thickness that is less than a thickness of the substrate, and wherein surfaces of the plurality of sensors are coplanar with the chucking surface;
    a wireless communication module embedded in the substrate and electrically coupled to each of the plurality of sensors, wherein a surface of the wireless communication module is coplanar with a surface of the substrate opposite to the chucking surface; and
    wherein the chucking force measurements are obtained from the plurality of thin film sensors in real-time during execution of a process recipe by using the wireless communication module that operates at a frequency that does not interfere with a frequency of a plasma generated in the processing tool during execution of the process recipe.

2. The apparatus of claim 1, wherein the thickness of the plurality of sensors is less than 100 μm.

3. The apparatus of claim 1, wherein an area of the chucking surface covered by the plurality of sensors is less than 30% of a total area of the chucking surface.

4. The apparatus of claim 1, wherein the wireless communication module operates at 2.4 GHz.

5. The apparatus of claim 1, wherein the wireless communication module operates in accordance with Bluetooth, WiFi, or Zigbee protocols.

6. The apparatus of claim 1, wherein the thin film sensors comprise a material that has a variable resistance corresponding to a pressure applied to the sensor.

7. The apparatus of claim 1, wherein the substrate is a silicon wafer.

8. The apparatus of claim 1, wherein the wireless communication module is embedded in the substrate.

* * * * *